US008959465B2

United States Patent
Nyhus et al.

(10) Patent No.: US 8,959,465 B2
(45) Date of Patent: Feb. 17, 2015

(54) TECHNIQUES FOR PHASE TUNING FOR PROCESS OPTIMIZATION

(75) Inventors: Paul A. Nyhus, Portland, OR (US); Shem O. Ogadhoh, Beaverton, OR (US); Swaminathan Sivakumar, Beaverton, OR (US); Seongtae Jeong, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/997,565

(22) PCT Filed: Dec. 30, 2011

(86) PCT No.: PCT/US2011/068157
§ 371 (c)(1),
(2), (4) Date: Jun. 24, 2013

(87) PCT Pub. No.: WO2013/101202
PCT Pub. Date: Jul. 4, 2013

(65) Prior Publication Data
US 2014/0053117 A1  Feb. 20, 2014

(51) Int. Cl.
*G06F 17/50* (2006.01)
*G03F 1/36* (2012.01)
*G03F 1/70* (2012.01)

(52) U.S. Cl.
CPC .............. *G06F 17/5009* (2013.01); *G03F 1/36* (2013.01); *G06F 17/5068* (2013.01); *G03F 1/70* (2013.01)
USPC ............ 716/54; 716/50; 716/51; 716/52; 716/53; 716/55; 430/5; 430/30

(58) Field of Classification Search
USPC .................. 716/50–55; 430/5, 30
See application file for complete search history.

(56) References Cited

U.S. PATENT DOCUMENTS

| 5,316,896 A * | 5/1994 | Fukuda et al. ............... 430/322 |
| 6,902,851 B1 | 6/2005 | Babcock et al. |
| 7,642,019 B2 * | 1/2010 | Kim ............................. 430/30 |
| 2005/0124078 A1 | 6/2005 | Omori et al. |
| 2005/0208390 A1 | 9/2005 | Xiao |
| 2006/0019176 A1 | 1/2006 | Kim et al. |

FOREIGN PATENT DOCUMENTS

WO   2013/101202 A1   7/2013

OTHER PUBLICATIONS

International Search Report and Written Opinion received for PCT Patent Application No. PCT/US2011/068157, mailed on Sep. 19, 2012, 14 Pages.
Borodovsky, et al., "Pixelated Phase Mask as Novel Lithography RET," Optical Microlithography XXI, edited by Harry J. Levinson, Mircea V. Dusa, Proc. of SPIE vol. 6924, Mar. 7, 2008, pp. 69240E-1-69240E-14.

* cited by examiner

*Primary Examiner* — Nghia Doan
(74) *Attorney, Agent, or Firm* — Finch & Maloney PLLC

(57) ABSTRACT

Techniques are provided for determining how thick or how deep to make the phased regions of a lithography mask. One example embodiment provides a method that includes: providing a first mask layout design including a first test set, and providing a second mask layout design including a second test set, wherein the second test set is larger than the first test set; simulating critical dimensions through focus of structures of interest in the first test set for a range of phase depths/thicknesses, and selecting an initial preferred mask phase depth/thickness based on results of the simulating; and generating a fast thick-mask model (FTM) at the initial preferred phase depth/thickness, and correcting the second test set of the second mask layout design using the FTM, thereby providing an optimized mask layout design. A mask having the optimized mask layout design may be implemented to give the optimum patterning.

23 Claims, 7 Drawing Sheets

TECHNIQUES FOR PHASE TUNING FOR PROCESS OPTIMIZATION

BACKGROUND

As is known, lithography is commonly used when manufacturing integrated circuits. The process generally includes coating a photoresist layer on the surface of a semiconductor wafer, and then shining light through a mask with the desired pattern and focusing the light into the light sensitive photoresist. The mask typically has light non-transmissive (opaque) regions of chrome and light transmissive (transparent) regions of quartz. Radiation from a light source (e.g., ultra-violet or deep ultra-violet light, etc) and focused via an optical lens system is then applied to the mask. In any such cases, the light passes through the transparent mask regions and exposes the corresponding portion of the photoresist layer, and is blocked by the opaque mask regions to leave the other portions of photoresist layer unexposed. Depending on the specific process used, either the exposed or non-exposed regions of photoresist layer can then be removed, thereby leaving a patterned resist layer on the wafer, which in turn allows for subsequent processing of the wafer such as, for example, etching, depositing, and other typical semiconductor processes.

One conventional technique that enables smaller minimum device dimensions with relatively good contrast is generally referred to as alternating phase shift masking (APSM). APSM exploits the destructive interference caused by light passing through two adjacent transparent mask areas to create an unexposed area on the photoresist layer. In short, the phase of the light wave passing through and exiting the transparent mask regions is a function of the mask thickness, so mask thickness of adjacent mask regions can be selectively varied, such that the light exiting from those adjacent regions is out-of-phase which causes destructive interference (e.g., were light waves exiting from one adjacent area have a phase that is out-of-phase with the phase of light waves exiting from the other adjacent area, and the waves therefore cancel one another or otherwise yield a combined wave of diminished amplitude). Since the photoresist material is responsive to the intensity of the light, an unexposed area will be formed on the photoresist layer where the transparent regions of differing thicknesses are adjacent. Other mask technologies, such as chromeless phase shift lithography (CPL), can also be used to introduce phase offset between light passing through some parts of the mask relative to other parts of the mask.

BRIEF DESCRIPTION OF THE DRAWINGS

FIG. 2b schematically illustrates a top down view of an example mask of the photolithography tool shown in FIG. 2a.

FIG. 2c schematically illustrates a top down view of an example substrate having a layer of photoresist thereon that is patterned in accordance with the mask shown in FIG. 2b.

DETAILED DESCRIPTION

Techniques are provided for determining how thick or how deep to make the phased regions of a lithography mask. The techniques can be used to give the optimum patterning. Although the techniques can be used in forming any lithography mask, they are particularly useful when the size of the etched mask features or film are on the scale of the wavelength of light of the exposure system (or smaller), and when subresolution assist features are present.

General Overview

As previously explained, there are various lithography mask technologies, such as CPL and APSM, in which phase difference across the mask is used to improve aerial image quality. In such cases, the mask is engineered by etching the quartz, or by adding films, in such a way as to introduce a phase difference between light passing through some parts of the mask relative to other parts of the mask. The destructive interference between the various waves improves the aerial image contrast. When the size of the phased features is large compared to the wavelength of light of the exposure system, and the light source is coherent, it is generally straightforward to estimate the required quartz etch depth or thickness of applied film necessary to maximize aerial image contrast. In such cases, the optical properties of the films and quartz can be used to calculate film thicknesses or etch depth that will introduce 180° phase offset between phase delayed light and undelayed light. For many mask layouts, however, the size of the etched mask features or film are on the scale of the wavelength of light or smaller and when phased sub-resolution assist features are present, such phase calculations no longer are valid because of, for instance, the large amount of diffraction occurring, the interaction between closely spaced phase edges, and focus shifting due to three-dimensional mask effects. In addition, because some phase shift techniques such as CPL use strong off-axis illumination, light impinges on the mask at a large oblique angle which makes it difficult to determine in a simple manner the optimal phase depth.

Thus, and in accordance with an embodiment of the present invention, techniques are provided for determining how thick or how deep to make the phased regions of a lithography mask so as to give the optimum patterning, and to allow for full exploitation of phase technology. The techniques can be embodied, for instance, in one or more phase optimized lithography masks used in the fabrication of an integrated circuit design. Numerous applications will be apparent in light of this disclosure.

Figure 1A:
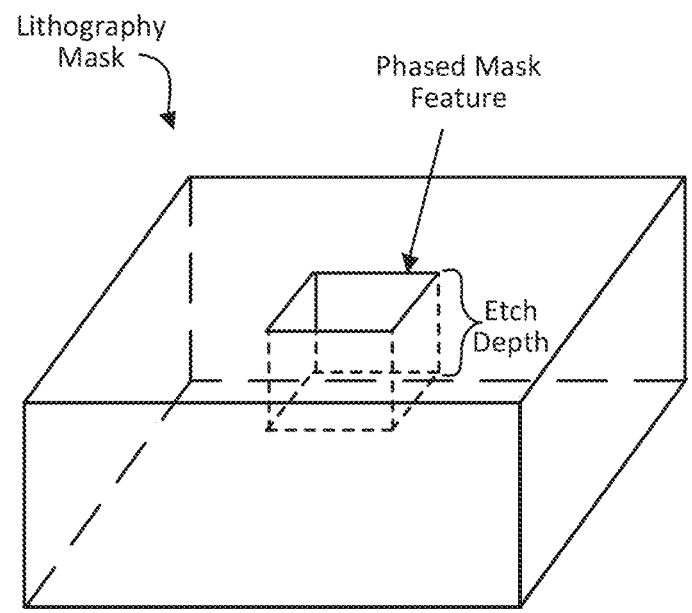
FIGS. 1a and 1b schematically illustrate a CPL mask configured with a phased mask feature.
Figure 1B:
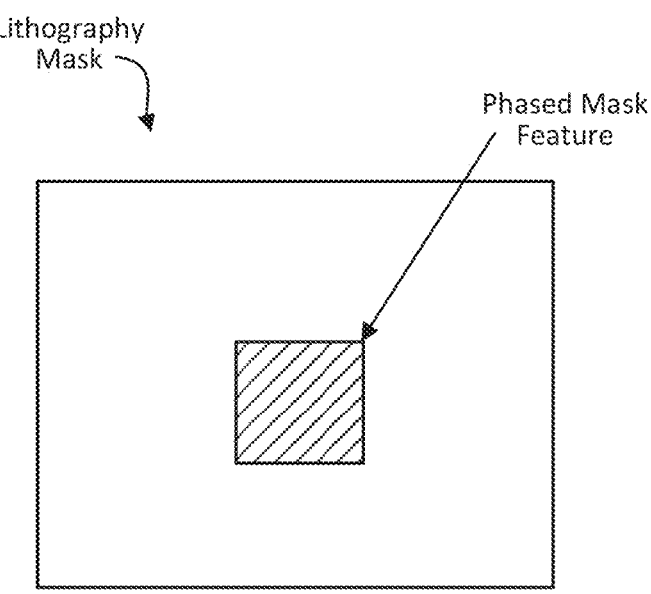

FIGS. 1a and 1b illustrate an example chromeless phase lithography (CPL) phased mask feature. CPL is a lithography technique that uses chromeless mask features to define circuit features. These mask features typically provide either 0-phase shift or pi-phase shift, and can be formed by either etching the quartz substrate to a depth corresponding to a 180° phase shift at the illumination wavelength of the exposure platform, or by adding phase shift layers on the quartz substrate so as to provide a 180° phase shift at the illumination wavelength of the exposure platform. FIG. 1a shows perspective and transparent views of the example CPL mask, and FIG. 1b shows a top down view of that mask. As can be seen, the parameter determining the phase is the etch depth in the quartz. This depth can he varied or otherwise tuned to optimize the aerial image contrast at the imaging wafer level, in accordance with an embodiment of the present invention.

Figure 2A:
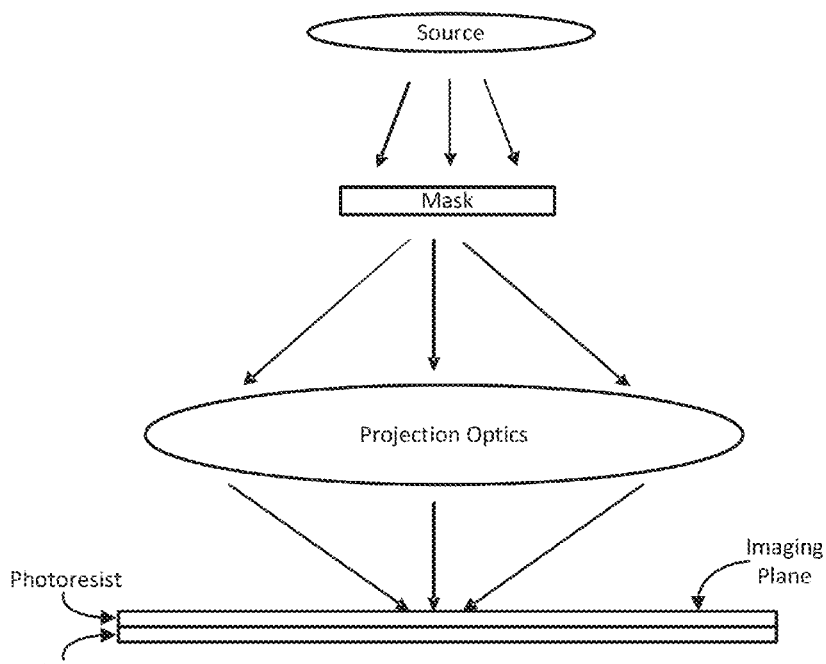
FIG. 2a schematically illustrates a typical photolithography tool.
Figures 2B, 2C:
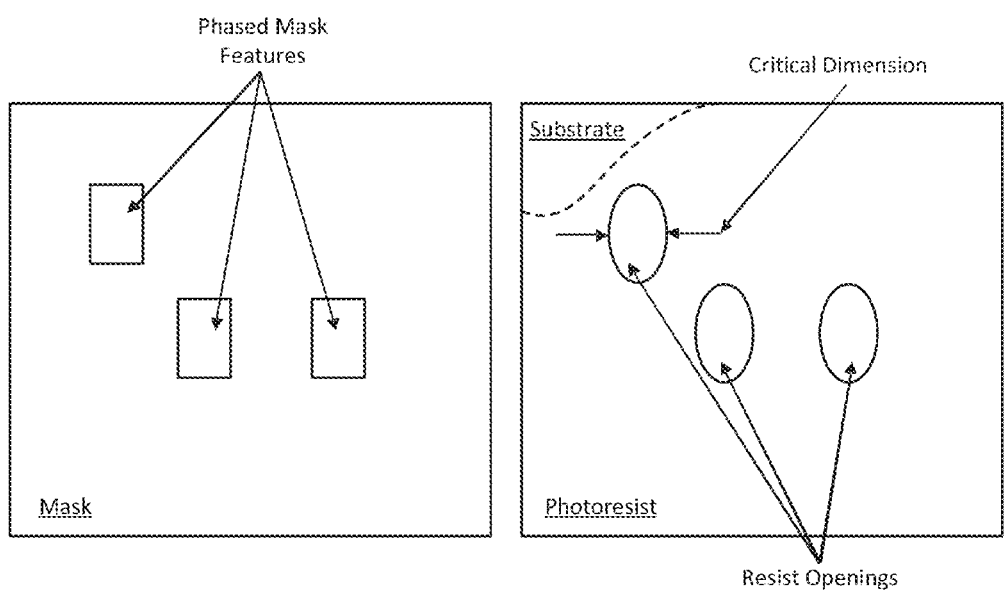

FIG. 2a schematically illustrates a typical photolithography tool, which may also be referred to as a microlithography tool or scanner or exposure system. As can he seen, the tool generally includes a light source, a mask to effectively pattern the light, and projection optics which focus the patterned light onto the imaging plane, which includes a substrate having a layer of photoresist thereon. FIG. 2b schematically illustrates a top down view of an example mask configuration that can be used with the tool, and FIG. 2c schematically illustrates a top down view of an example substrate having a layer of photoresist thereon that is patterned in accordance with the mask shown in FIG. 2b.

Such tools typically use monochromatic light for the light source to transfer patterns of a mask (sometimes referred to as a reticle) onto the light sensitive photoresist coated onto the substrate (e.g., silicon wafer or other suitable semiconductor substrate). For many applications, the dimensions of the openings in the photoresist need to be controlled to a very high tolerance. In such cases, the conditions under which the tool is operating can be controlled to minimize the error between the measured dimension (sometimes called the critical dimension, or CD, as shown in FIG. 2c) of the features in the photoresist and the desired dimensions (sometimes called the target dimensions). This is the error that is plotted in FIGS. 5a and 5b, which will be discussed in turn.

One source of variation on the tool leading to this CD deviation is the focus control of the tool. The image of the mask structure being focused into the photoresist on the substrate has a limited depth of focus. As the focus deviates from optimum focus, the CD deviates from the target CD until the resist is no longer open. Thus, the parameters of a process (e.g., mask, scanner settings, photoresist, and other such controllable factors) can he chosen so as to minimize the CD deviations from target for all the structures being imaged on the wafer simultaneously. The number of structures being imaged can vary greatly, and may he in the range of, for example, one to several or tens or hundreds or thousands or millions or even billions.

Many masks in use in the semiconductor industry are so-called binary masks. Binary masks are masks which either block light or allow it to pass. For example, for hole patterning with positive tone resists (resists in which light exposure results in resist removal), the mask consists mostly of an opaque material on the quartz mask substrate perforated by openings where light is allowed to pass to expose the photoresist and open holes in it. Since the openings in the opaquing material are typically as small as or smaller than the wavelength of light being used to image, there is a large amount of diffraction and refraction which makes it difficult to predict what the light profile (aerial image) in the photoresist will look like. Very computationally intensive software can be used to accurately predict how the light diffracts and refracts as it passes through the small features in the mask and their sidewalk to create the image at the substrate imaging plane. Without such accurate software, it would be difficult to know how big to make the opening in the mask to get the resist opening at the required CDs within the tight tolerance required.

There is another class of less widely used mask types called phase shifting masks which use phase differences between light passing through adjacent parts of the mask to create the desired aerial image in the photoresist. Examples of this mask type are APSM, CPL, and line end phase shift mask (LEPSM). Unlike binary masks, these masks have a third type of opening in the opaquing material which allows light through but which introduces a phase shift of 180° to the light compared to light passing through the standard photoresist openings in the mask. When light from the two types of openings interfere at the wafer plane, the destructive interference can produce better aerial image contrast (which generally refers to the sharpness of transition from bright to dark areas) and therefore improve the control of the critical dimension of features of a given layout. In this sense, the precise phase difference can be selected or otherwise tuned for optimum imaging. If the phase difference is too small or too large, then the destructive interference will not be as pronounced, and the full benefit of the phase shifting will not be realized or otherwise suboptimal imaging will result.

The desired phase shift can be produced by etching into the transparent quartz (or other light transmissive region) to a corresponding depth as discussed with reference to FIGS. 1a and 1b. This depth is directly related to the phase introduced and can be precisely controlled, as will be apparent in light of this disclosure. In addition, because the size of these pits or plateaus (generally, phased mask features) are small compared to the wavelength of light and because there are sidewalls in the trenches or plateaus to diffract the light, it is generally not straightforward to understand how deep the trench must be in the mask (or how tall the plateau on the mask must be) to provide the best contrast overall. The only way to determine the best depth is to do very computationally intensive simulations of various depths and various focus settings on the scanner to find out which provides the best aerial image contrast. Depending on the mask complexity, to do such computation can be highly impractical if not impossible. For instance, and assuming a mask having millions of features that can he organized in millions of different configurations, it would take years to solve the problem for one mask and one set of scanner conditions. Given current business development cycles and realities of conducting a robust business, such simulations need to be done much more quickly (on the order of days or weeks or maybe months). Various embodiments of the present invention provide techniques for optimizing the mask etch depth to provide the best imaging for the millions of structures on the mask for a given set of scanner conditions.

Methodology

Figure 3:
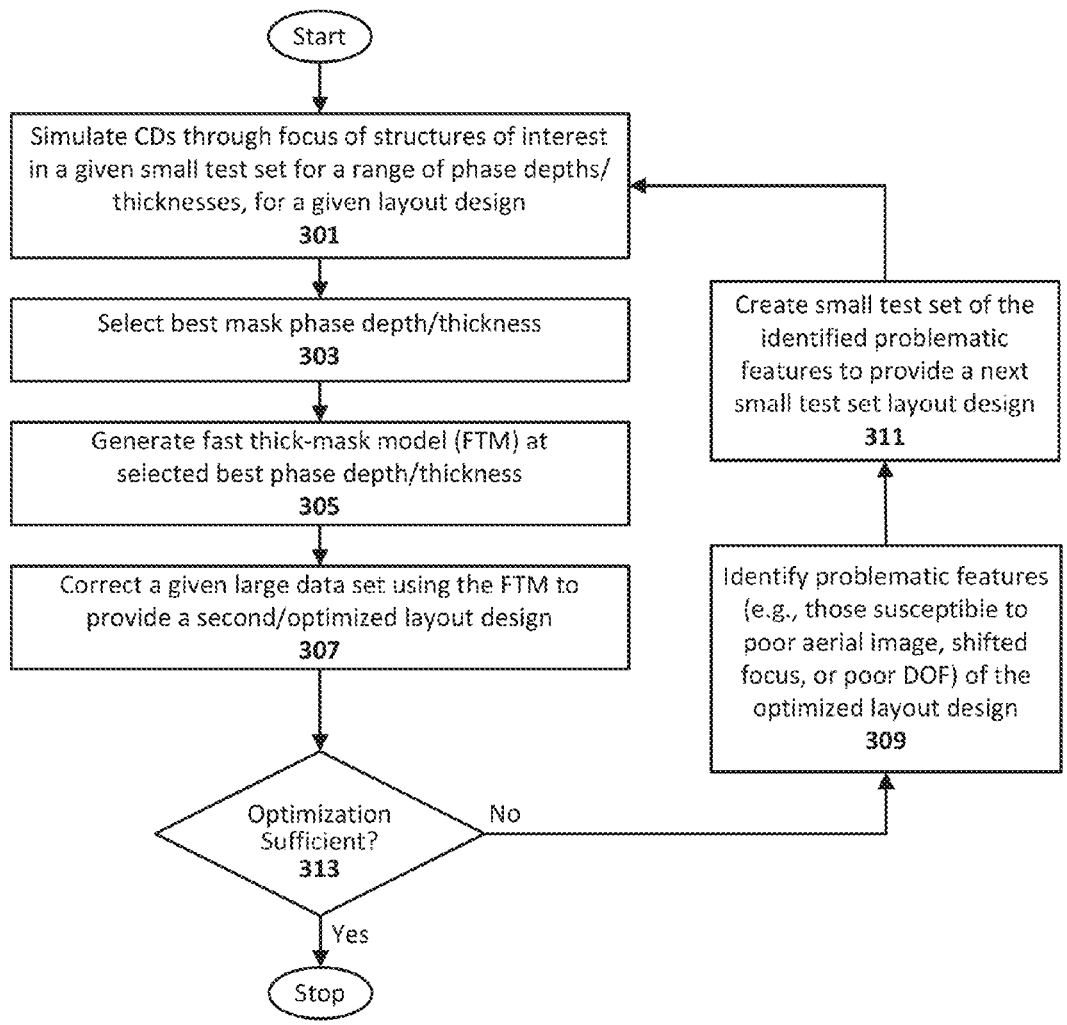
FIG. 3 illustrates a method for phase tuning a lithography mask for process optimization, in accordance with an embodiment of the present invention.

FIG. 3 illustrates a method for phase tuning a lithography mask for process optimization, in accordance with an embodiment of the present invention. The method can generally be executed using existing simulation tools and standard optical proximity correction (OPC) techniques. In addition, this example embodiment uses two mask layout designs. The first mask layout is generally referred to herein as the large test set, and the second mask layout is generally referred to herein as the small test set. Examples of such simulation tools and mask layouts will now be discussed in turn. Numerous variations will be apparent in light of this disclosure.

In accordance with one example embodiment of the present invention, two types of existing simulation software can be used in carrying out the method. A so-called accurate program which uses algorithms to provide the most accurate simulation of what happens as light passes through the mask and is focused on the substrate. This is sometimes referred to as a rigorous lithography simulation tool (RLST). In general, an RLST is programmed or otherwise configured to effectively provide rigorous solutions to Maxwell's equations for the transmission of light through a given mask, and can therefore accurately capture the effect of different trench depths in the mask on imaging. The price of this accuracy associated with the RLST is relatively very long run times on a computer. As previously explained, simulating even a handful of structures accurately under the time constraints of a given development schedule can be challenging. The second software suite or tool according to one such embodiment is a so-called fast thick-mask model (FTM) simulator, which is programmed or otherwise configured to calculate the image profile at the imaging plane based on the mask field. In general, an FTM tool is a version of an RLST which takes into account most of the optical effects that occur at the mask during imaging, but orders of magnitude faster than an RLST. The price for this speed is accuracy, as well as time up-front for the RLST to generate the libraries used to do the FTM simulation. The advantage is that an FTM tool can look at a much greater variety of structures than an RLST for a given time so that it can be used to ensure that all of the features on the mask are imaged properly. Again, the number of features may range from a handful to millions or even billions of features, depending on circuit design and time allocated for a given design development plan. In addition to RLST and FTM simulation modules, and in accordance with some example embodiments, the method further employs fast optical proximity correction (OPC) software that can use the generated FTM to identify hot spots or problematic design areas through focus in realistic layouts. As will be appreciated, the RLST and FTM simulation modules as well as the OPC module may be executed on a general purpose computer that meets the minimum requirements of the RLST/FTM/OPC tools (e.g., with respect to processor speed, memory, operating system, etc). As will be further appreciated, each of these software tools may include multiple modules or routines that provide the desired computational functionality as well as other typical software components such as a graphical user interface and data logging modules.

Figure 6A:
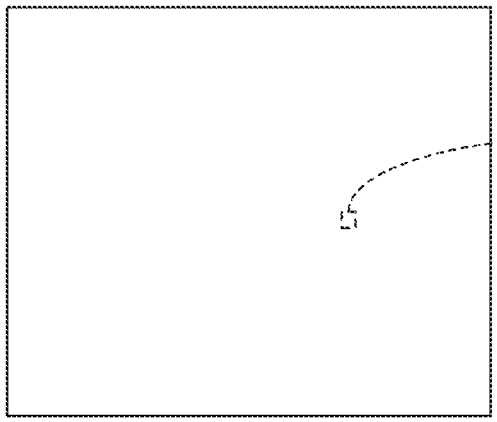
FIGS. 6a and 6b illustrate an example of a large test set showing a multitude of layouts exploring the available design rule space, in accordance with an embodiment of the present invention.
Figure 6B:
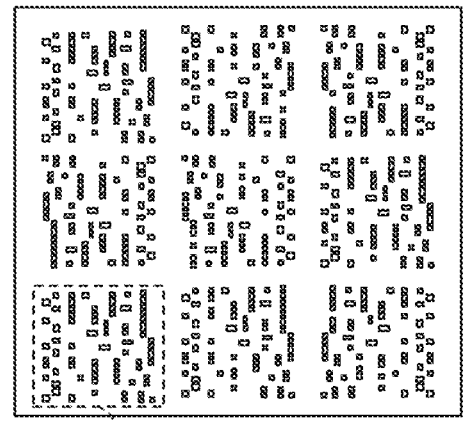
Figure 6C:
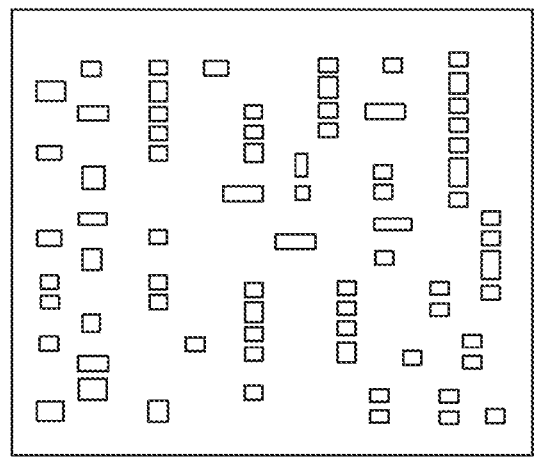
FIG. 6c illustrate an example of a small test set which can be handled accurately by a simulation program in a reasonable amount of time, in accordance with an embodiment of the present invention.

As previously indicated, the method of this example embodiment uses two mask layout designs. The first mask layout generally has a large variety of designs which exercise a wide range of a given design rule space of interest generally referred to herein as the large test set). The second mask layout is generally a much smaller set of designs which can be initially chosen, for instance, using engineering judgment and knowledge of design rules. This initial test set is small enough to be simulated by RLST in a reasonable amount of time based on, for example, allocated time in accordance with a given development plan timeline (generally referred to herein as the small test set). FIGS. 6a and 6b illustrate an example of a large test set showing tens of thousands of layouts exploring the available design rule space, in accordance with an embodiment of the present invention. FIG. 6c illustrates an example of a small test set that can be handled accurately by an RLST in a reasonable amount of time, in accordance with an embodiment of the present invention.

Now with reference to FIG. 3, the method begins with simulating 301 the CDs through focus of structures of interest in a small test set for a range of phase depths/thicknesses, for a given design layout. As previously explained, phase depth generally applies where the phased feature is etched and phase thickness generally applies where a film or other material is deposited or otherwise built-up on the mask to provide the phased feature. In general, the small test set may include, for instance, any number of features that can be processed in the allocated time per a given development plan. In one example case, the number of features included in the small test set is in the range of 10 to 1000. Note, however, that the claimed invention is not intended to be limited to test sets of any particular size range, per se. Further note that not all structures within a given test set or design layout need to be analyzed. For instance, in some example embodiments, the CDs through focus of only certain key/problematic structures in the small test set (such as end-to-end lines spaces and/or structures susceptible to pinching and/or other such problematic features) are simulated using the RLST for a range of etch depths or film thicknesses while keeping the layout the same. In some example cases, the CDs at a chosen E0p and aerial image slice through key (or otherwise selected) features are analyzed for focus centering, depth of focus, and aerial image contrast for phase depth/thickness skew. Other embodiments may include additional or different analysis parameters, as will be appreciated in light of this disclosure.

Figure 4:
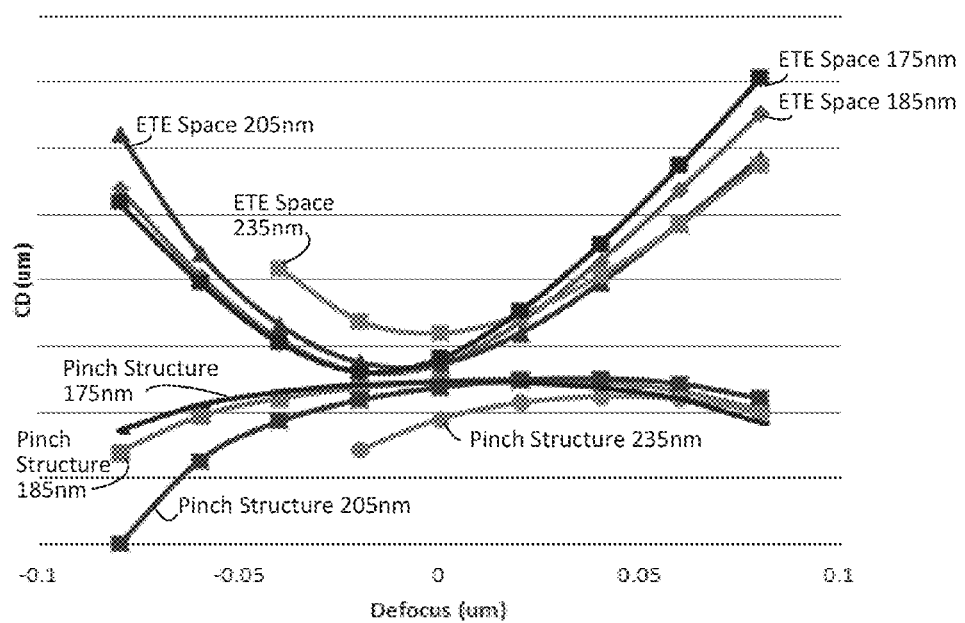
FIG. 4 illustrates simulation results for critical dimensions (CD) through focus of various features of a given mask layout, in accordance with an embodiment of the present invention.

The method continues with selecting 303 the best or otherwise preferred mask phase depth/thickness based on the RLST simulation results. FIG. 4 illustrates example RLST simulation results for CDs through focus of various features of a given mask layout, in accordance with an example embodiment of the present invention. In particular, FIG. 4 graphically illustrates the RLST results for a small test set (such as the example one shown in FIG. 6c) showing CD through focus of an end-to-end (ETE) space and a structure susceptible to pinching, as labeled and further represented by different shapes in the plots shown in FIG. 4. As can be further seen, as the phase depth/thickness is varied from 235 nm to 175 nm (as labeled for each plot shown in FIG. 4), the overall depth of focus improves due to flattening of the curves and decrease of the center focus shift between the two structures. Thus, an initial estimate of phase depth/Thickness can be chosen which gives, for instance, the best overall depth of focus and overall aerial image quality. In the example test set shown in FIG. 4, 175 nm was chosen as the initial best phase depth/thickness. As will now be explained, a fast thick-mask model (FTM) is created for this phase depth/thickness.

With further reference to FIG. 2, the method continues with generating 305 a fast thick-mask model (FTM) at the initial best/preferred phase depth/thickness, and then correcting 307 the large data set using the FTM to provide a second or otherwise further optimized layout design.

Figure 5A:
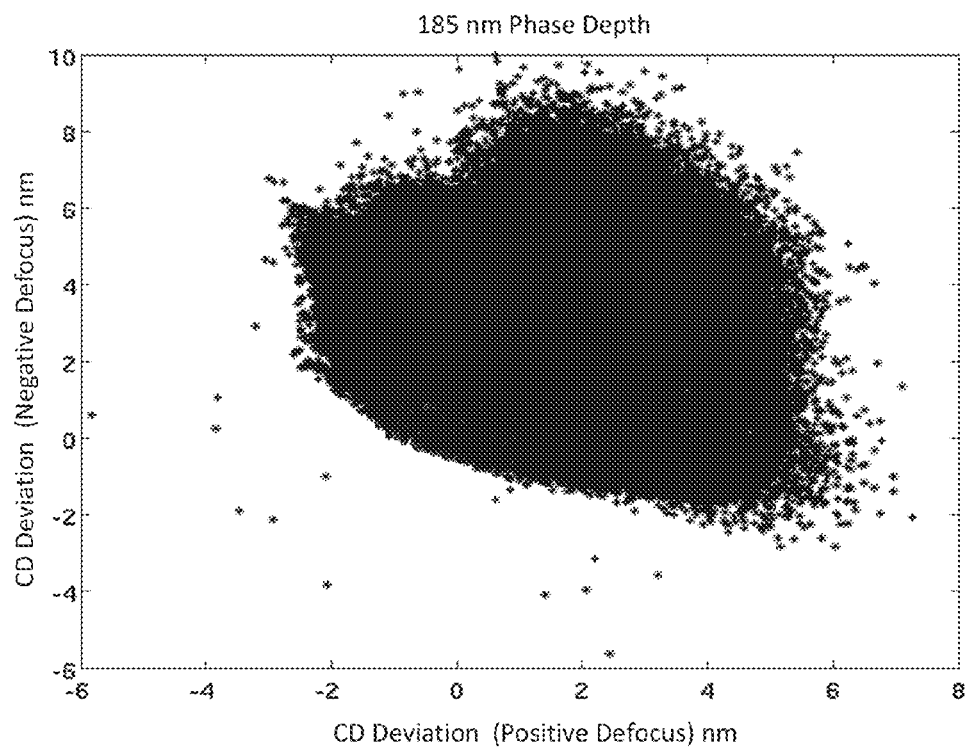
FIGS. 5a and 5b each shows a summary of through focus analysis of a large layout test set for two phase depths, respectively, in accordance with an embodiment of the present invention, wherein each point represents one feature in the layout, the x-axis is the positive defocus CD deviation from the CD at target defocus, and the y-axis is the negative defocus CD deviation from the CD at target defocus.
Figure 5B:
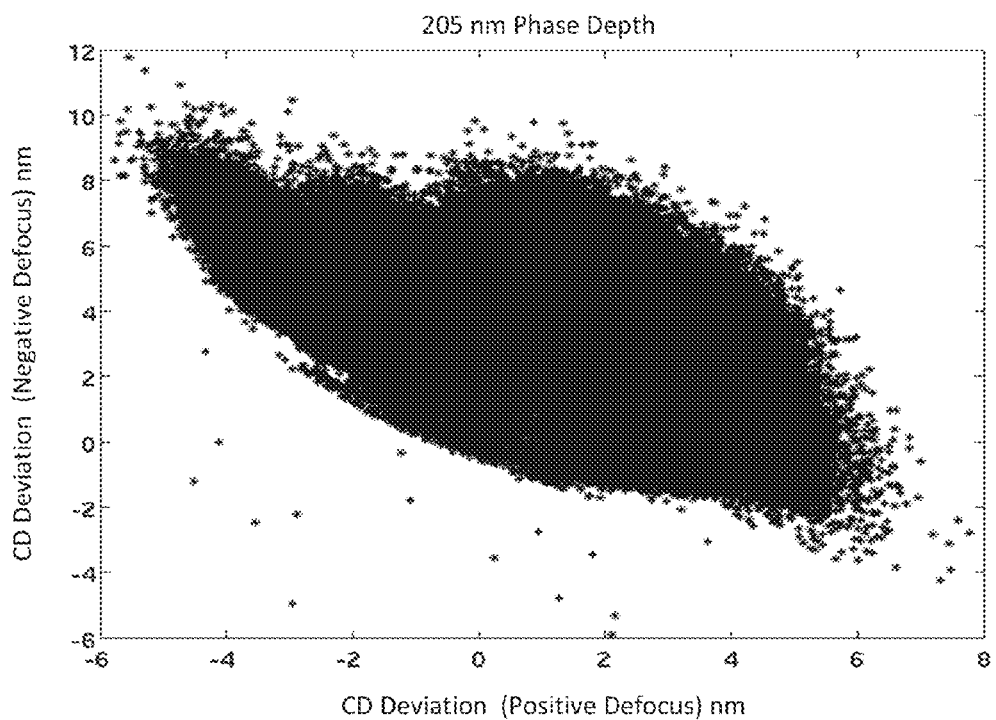

The results can then be analyzed. Thus, in this example case, the method continues with a determination at 313 as to whether the optimization is sufficient, based on, for example, a given design criteria or set of rules. The desired level of optimization will vary from one embodiment to the next. In some example embodiments, the parameters considered include one or more of through focus, contrast, and/or mask error enhancement factor (MEEF). For instance, FIG. 5a shows a summary of through focus analysis of the further optimized large layout design test set for a phase depth of 185 nm, and FIG. 5b shows a summary of through focus analysis of that layout design test set for a phase depth of 205 nm. Each point represents a different CD measurement on a different structure on the mask. In this example case, tens of thousands of structures are reported. The x-axis shows the CD deviation in nanometers from the desired target CD for a fixed positive defocus setting (a focus setting which is out of focus in the positive direction relative to best focus). The y-axis shows the same CD error for a negative defocus (out of focus) setting. This range of focus settings can be chosen in effort to capture the worst focus variation which the scanner is expected to have. Ideally, all the points would lie at point 0 nm,0 nm. This would mean that as the scanner drifts out of focus, none of the CDs on the substrate change and perfect imaging is preserved. In reality, because of the finite depth of focus of the scanner, CDs drift off target as the focus drifts. Thus, instead of one point at 0,0, a cluster of points centered near 0,0 is provided, as shown. As will be appreciated, the smaller the deviation from 0,0, the better the depth of focus. In accordance with some embodiments of the present invention, the goal is to have the cluster be as tight as possible around 0,0. In this example case, the 185 nm phase depth/thickness plot of FIG. 5a has a tighter cluster than the 205 nm phase depth plot of FIG. 5b. Said differently, the worst case deviations are smaller for all conditions (in both the x-axis and y-axis directions) for 185 nm phase depth/thickness, than they are for the 205 nm phase depth/thickness. This means, for example, that a phase depth/thickness of 185 nm provides better CD control and is an improvement over the 205 nm phase depth/thickness. In addition to the CD control which can be measured or otherwise analyzed as in FIGS. 5a-b, analysis of the further optimized large test set results can be looked at for other problems which result in poor CD control, such as poor contrast and MEEF as previously explained.

Figure 7:
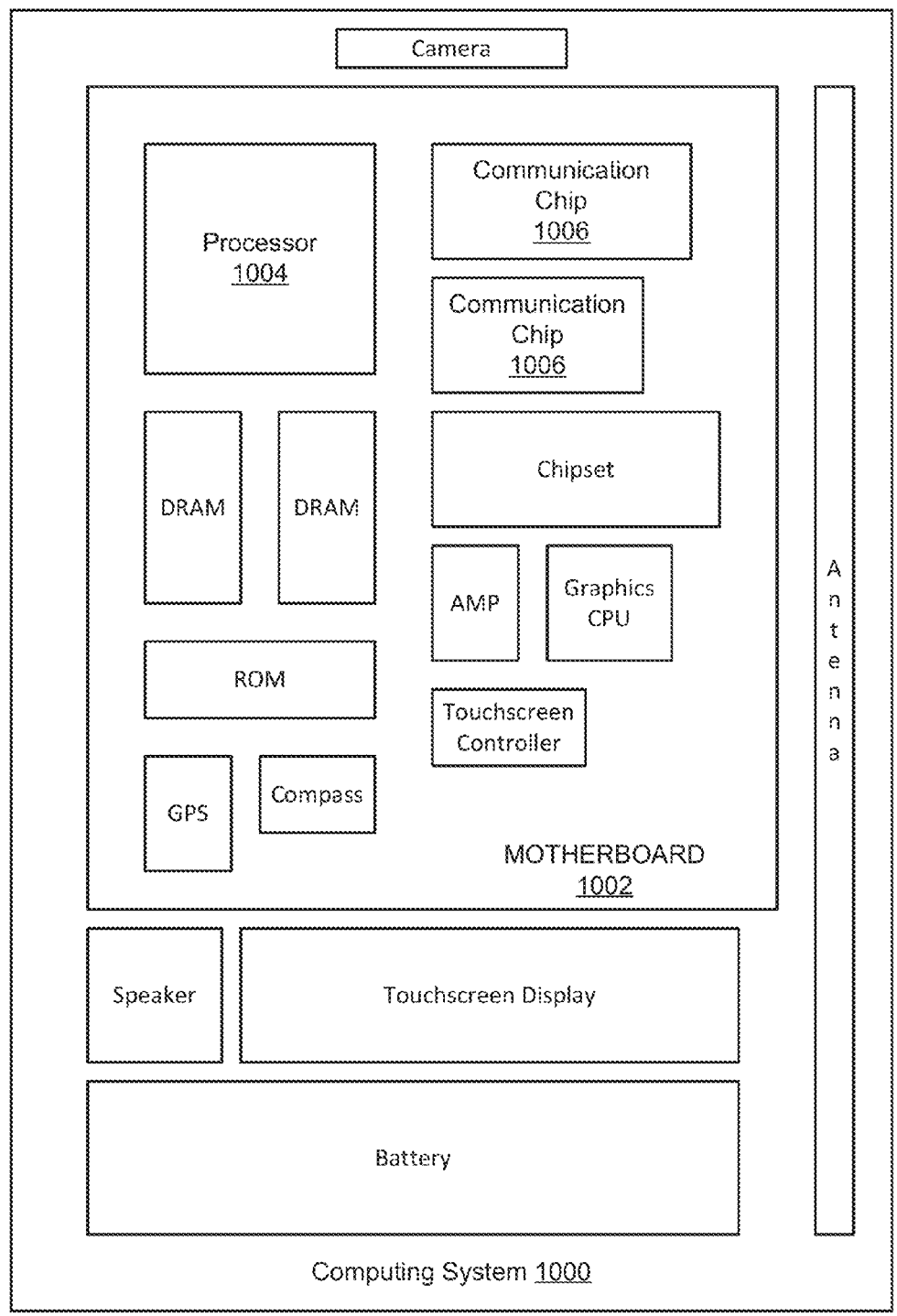
FIG. 7 illustrates a computing system implemented with one or more integrated circuit structures or devices formed using a lithography mask optimized in accordance with an embodiment of the present invention.

If such analysis at 313 concludes that sufficient optimization has been achieved, then the method concludes and an optimal mask design (with respect to phase depth or phase thickness) is thus provided. However, if analysis at 313 concludes that sufficient optimization has not been achieved, then the method of this example embodiment continues with identifying 309 sub-optimal or otherwise problematic features (e.g., poor aerial image, shifted focus, poor MEEF, or poor depth of focus) of the second/optimized layout design. In one example embodiment, an OPC tool is used to identify such problematic configurations which have poor aerial image, shifted focus, poor MEEF, or poor depth of focus (as discussed with reference to FIGS. 5a-b). The method continues with creating 311 small test set of the identified sub-optimal features to provide a next small test set layout design. Then, the method effectively repeats, but on the new small test set layout. Thus, the method continues with simulating 301 CDs through focus of features in the new small test set layout design for a range of phase depths/thicknesses using the RLST, selecting 303 the best/preferred mask phase depth/thickness, generating 305 an FTM at the selected best/preferred phase depth/thickness, and correcting 307 the large data set using the latest FTM to provide a further optimized layout design. Thus, a small test set of challenging hot spot features associated with the optimized large layout design test set from 307 can be assembled into a small test set layout design for use with the RLST. The RLST can then be used to simulate, for instance, the aerial image of this new small test set layout with various etch depths or film thicknesses. As previously discussed with reference to FIG. 4, the focus centering, depth of focus, and aerial image contrast can be compared for the various mask skews and a new etch depth or film thickness can be identified. FTM analysis of the new phase depth/thickness can be repeated to identify any new problem structures and a new small test set can be generated from the problem structures for RLST analysis at various mask skews. After two or more iterations, a final etch depth or film thickness can be chosen to provide an optimal mask design Example System FIG. 7 illustrates a computing system implemented with one or more integrated circuit structures or devices formed using lithography masks optimized in accordance with an embodiment of the present invention. As can be seen, the computing system 1000 houses a motherboard 1002. The motherboard 1002 may include a number of components, including, but not limited to, a processor 1004 and at least one communication chip 1006, each of which can be physically and electrically coupled to the motherboard 1002, or otherwise integrated therein. As will be appreciated, the motherboard 1002 may be, for example, any printed circuit board, whether a main board, a daughterboard mounted on a main board, or the only board of system 1000, etc. Depending on its applications, computing system 1000 may include one or more other components that may or may not be physically and electrically coupled to the motherboard 1002. These other components may include, but are not limited to, volatile memory (e.g., DRAM), non-volatile memory (e.g., ROM) a graphics processor, a digital signal processor, a crypto processor, a chipset, an antenna, a display, a touchscreen display, a touchscreen controller, a battery, an audio codec, a video codec, a power amplifier, one or more filters (e.g., LC-tank, high-pass, low-pass, bandpass filters), a global positioning system (UPS) device, a compass, an accelerometer, a gyroscope, a speaker, a camera, and a mass storage device (such as a hard disk drive, compact disk (CD), digital versatile disk (DVD), and so forth). Any of the components included in computing system 1000 may include one or more integrated circuit structures or features formed using a lithography mask optimized in accordance with an embodiment of the present invention. These structures or features can be used, for instance, to implement a transistor, a conductive run, or other circuit including small features. In some embodiments, multiple functions can be integrated into one or more chips (e.g., for instance, note that the communication chip 1006 can be part of or otherwise integrated into the processor 1004).

The communication chip 1006 enables wireless communications for the transfer of data to and from the computing system 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, IDMA, DECT, Bluetooth, derivatives thereof, as well as any other wireless protocols that are designated as 3G, 4G, 5G, and beyond. The computing system 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as UPS, EDGE, GPRS, CDMA, WiMAX, LTE, Ev-DO, and others.

The processor 1004 of the computing system 1000 includes an integrated circuit die packaged within the processor 1004. In some embodiments of the present invention, the integrated circuit die of the processor includes onboard circuitry that is implemented with one or more integrated circuit structures or features formed using a lithography mask having an optimized phase depth/thickness as variously described herein. The term "processor" may refer to any device or portion of a device that processes, for instance, electronic data from registers and/or memory to transform that electronic data into other electronic data that may he stored in registers and/or memory.

The communication chip 1006 also may include an integrated circuit die packaged within the communication chip 1006. In accordance with some such example embodiments, the integrated circuit die of the communication chip includes one or more integrated circuit structures or features formed using a lithography mask optimized as described herein. As will be appreciated in light of this disclosure, note that multi-standard wireless capability may be integrated directly into the processor 1004 (e.g., where functionality of any chips 1006 is integrated into processor 1004, rather than having separate communication chips). Further note that processor 1004 may be a chip set having such wireless capability. In short, an number of processor 1004 and/or communication chips 1006 can be used. Likewise, any one chip or chip set can have multiple functions integrated therein.

In various implementations, the computing system 1000 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the system 1000 may be any other electronic device that processes data or employs integrated circuit structures or features formed using a lithography mask having an optimized phase depth/thickness in accordance with an embodiment of the present invention as described herein.

Numerous embodiments will be apparent in light of this disclosure. One example embodiment provides a method for phase tuning a lithography mask. The method includes providing a first mask layout design including a first test set, and providing a second mask layout design including a second test set, wherein the second test set is larger than the first test set. The method further includes simulating critical dimensions through focus of structures of interest in the first test set for a range of phase depths/thicknesses, and selecting an initial preferred mask phase depth/thickness based on results of the simulating. The method further includes generating a fast thick-mask model (FTM) at the initial preferred phase depth/thickness, and correcting the second test set of the second mask layout design using the FTM, thereby providing an optimized mask layout design. In some cases, the method includes determining whether phase depth/thickness optimization is sufficient. In some such cases, in response to determining phase depth/thickness optimization is sufficient, the method includes providing a mask layout design having an optimal phase depth/thickness. In other such cases, in response to phase depth/thickness optimization being insufficient, the method further includes identifying problematic features of the optimized mask layout design, and creating a next small test set of the identified problematic features to provide a next small test set mask layout design. In some such cases, the method further includes simulating critical dimensions through focus of features in the next small test set mask layout design for a range of phase depths/thicknesses, and selecting a next preferred mask phase depth/thickness based on results of the simulating critical dimensions through focus of features in the next small test set mask layout design. In some such cases, the method further includes generating a next FTM at the selected next preferred phase depth/thickness based on results of the simulating critical dimensions through focus of features in the next small test set mask layout design, and further correcting the second test set of the second mask layout design using the next FTM, thereby providing a further optimized mask layout design. In some such cases, the method further includes repeating the determining (analyze optimization). In some such cases, in response to phase depth/thickness optimization still being insufficient, the method further includes: identifying problematic features of the further optimized mask layout design; creating a next small test set of the identified problematic features to provide a next small test set mask layout design; simulating critical dimensions through focus of features in the next small test set mask layout design for a range of phase depths/thicknesses; selecting a next preferred mask phase depth/thickness based on results of the simulating critical dimensions through focus of features in the next small test set mask layout design; generating a next FTM at the selected next preferred phase depth/thickness based on results of the simulating critical dimensions through focus of features in the next small test set mask layout design; and further correcting the second test set of the second mask layout design using the next FTM, thereby providing a further optimized mask layout design. In some specific example cases, simulating critical dimensions is carried out using a rigorous lithography simulation tool, and the critical dimensions are analyzed for at least one of focus centering, depth of focus, and/or aerial image contrast for phase depth/thickness skew. In some specific example cases, the first test set includes less than 1000 features of interest and the second mask layout design includes greater than 1000 features of interest. Numerous variations will be apparent in light of this disclosure. For instance, another embodiment of the present invention provides a lithography mask made using the method variously described in this paragraph. Another embodiment provides a lithography system comprising the mask.

Another embodiment of the present invention provides a method for phase tuning a lithography mask. The method of this example case includes providing a first mask layout design including a first test set, and providing a second mask layout design including a second test set, wherein the second test set is larger than the first test set. The method further includes simulating critical dimensions through focus of structures of interest in the first test set for a range of phase depths/thicknesses, and selecting an initial preferred mask phase depth/thickness based on results of the simulating. The method further includes generating a fast thick-mask model (FTM) at the initial preferred phase depth/thickness, and correcting the second test set of the second mask layout design using the FTM, thereby providing an optimized mask layout design. In response to determining that phase depth/thickness optimization is sufficient, the method further includes providing a mask that embodies the optimal phase depth/thickness. In response to determining that phase depth/thickness optimization is insufficient, the method includes: identifying problematic features of the optimized mask layout design; creating a next small test set of the identified problematic features to provide a next small test set mask layout design; simulating critical dimensions through focus of features in the next small test set mask layout design for a range of phase depths/thicknesses; selecting a next preferred mask phase depth/thickness based on results of the simulating critical dimensions through focus of features in the next small test set mask layout design; generating a next FTM at the selected next preferred phase depth/thickness based on results of the simulating critical dimensions through focus of features in the next small test set mask layout design; further correcting the second test set of the second mask layout design using the FTM, thereby providing a further optimized mask layout design; and determining whether phase depth/thickness optimization is sufficient for the further optimized mask layout design. Another embodiment provides a lithography mask made using the method as variously described in this paragraph. Another embodiment provides a lithography system comprising the mask.

Another embodiment of the present invention provides a method for making a lithography mask. In this example case, the method includes providing a first mask layout design including a first test set, and providing a second mask layout design including a second test set, wherein the second test set is larger than the first test set. The method further includes simulating critical dimensions through focus of structures of interest in the first test set for a range of phase depths/thicknesses, and selecting an initial preferred mask phase depth/thickness based on results of the simulating. The method continues with generating a fast thick-mask model (FTM) at the initial preferred phase depth/thickness, and correcting the second test set of the second mask layout design using the FTM, thereby providing an optimized mask layout design. The method continues with implementing a lithography mask having the optimized mask layout design. In some cases, the method includes determining whether phase depth/thickness optimization is sufficient. In some such cases, in response to determining that phase depth/thickness optimization is sufficient, the method includes providing a mask layout design having an optimal phase depth/thickness. In other such cases, in response to phase depth/thickness optimization being insufficient, the method includes identifying problematic features of the optimized mask layout design, and creating a next small test set of the identified problematic features to provide a next small test set mask layout design. In one such case, the method continues with simulating critical dimensions through focus of features in the next small test set mask layout design for a range of phase depths/thicknesses, and selecting a next preferred mask phase depth/thickness based on results of the simulating critical dimensions through focus of features in the next small test set mask layout design. In one such case, the method continues with generating a next FTM at the selected next preferred phase depth/thickness based on results of the simulating critical dimensions through focus of features in the next small test set mask layout design, and further correcting the second test set of the second mask layout design using the next FTM, thereby providing a further optimized mask layout design. In one such case, the method continues with repeating the determining. In one such case, in response to phase depth/thickness optimization still being insufficient, the method further includes: identifying problematic features of the further optimized mask layout design; creating a next small test set of the identified problematic features to provide a next small test set mask layout design; simulating critical dimensions through focus of features in the next small test set mask layout design for a range of phase depths/thicknesses; selecting a next preferred mask phase depth/thickness based on results of the simulating critical dimensions through focus of features in the next small test set mask layout design; generating a next FTM at the selected next preferred phase depth/thickness based on results of the simulating critical dimensions through focus of features in the next small test set mask layout design; and further correcting the second test set of the second mask layout design using the next FTM, thereby providing a further optimized mask layout design.

The foregoing description of example embodiments of the invention has been presented for the purposes of illustration and description. It is not intended to be exhaustive or to limit the invention to the precise forms disclosed. Many modifications and variations are possible in light of this disclosure. It is intended that the scope of the invention be limited not by this detailed description, but rather by the claims appended hereto.

What is claimed is:

1. A computer-implemented method for phase tuning a lithography mask, comprising:
   providing a first mask layout design including a first test set;
   providing a second mask layout design including a second test set, wherein the second test set is larger than the first test set;
   simulating, by a processor, critical dimensions through focus of structures of interest in the first test set for a range of phase depths/thicknesses;
   selecting an initial preferred mask phase depth/thickness based on results of the simulating;
   generating, by the processor, a fast thick-mask model (FTM) at the initial preferred phase depth/thickness; and
   correcting the second test set of the second mask layout design using the FTM, thereby providing an optimized mask layout design.

2. The method of claim 1 further comprising:
   determining whether phase depth/thickness optimization is sufficient.

3. The method of claim 2 further comprising:
   in response to determining that phase depth/thickness optimization is sufficient, providing a mask layout design having an optimal phase depth/thickness.

4. The method of claim 2 wherein in response to phase depth/thickness optimization being insufficient, the method further comprises:
   identifying problematic features of the optimized mask layout design; and
   creating a next small test set of the identified problematic features to provide a next small test set mask layout design.

5. The method of claim 4 further comprising:
   simulating, by the processor, critical dimensions through focus of features in the next small test set mask layout design for a range of phase depths/thicknesses; and
   selecting a next preferred mask phase depth/thickness based on results of the simulating critical dimensions through focus of features in the next small test set mask layout design.

6. The method of claim 5 further comprising:
   generating, by the processor, a next FTM at the selected next preferred phase depth/thickness based on results of the simulating critical dimensions through focus of features in the next small test set mask layout design; and
   further correcting the second test set of the second mask layout design using the next FTM, thereby providing a further optimized mask layout design.

7. The method of claim 6 further comprising repeating the determining.

8. The method of claim 7 wherein in response to phase depth/thickness optimization still being insufficient, the method further comprises:
   identifying problematic features of the further optimized mask layout design;
   creating a next small test set of the identified problematic features to provide a next small test set mask layout design;
   simulating, by the processor, critical dimensions through focus of features in the next small test set mask layout design for a range of phase depths/thicknesses;

selecting a next preferred mask phase depth/thickness based on results of the simulating critical dimensions through focus of features in the next small test set mask layout design;

generating, by the processor, a next FTM at the selected next preferred phase depth/thickness based on results of the simulating critical dimensions through focus of features in the next small test set mask layout design; and further correcting the second test set of the second mask layout design using the next FTM, thereby providing a further optimized mask layout design.

9. The method of claim 1 wherein simulating critical dimensions is carried out using a rigorous lithography simulation tool, and the critical dimensions are analyzed for at least one of focus centering, depth of focus, and/or aerial image contrast for phase depth/thickness skew.

10. The method of claim 1 wherein the first test set includes less than 1000 features of interest and the second mask layout design includes greater than 1000 features of interest.

11. A lithography mask made using the method of claim 1.

12. A lithography system comprising the mask of claim 11.

13. A computer-implemented method for phase tuning a lithography mask, comprising:

providing a first mask layout design including a first test set;

providing a second mask layout design including a second test set, wherein the second test set is larger than the first test set;

simulating, by a processor, critical dimensions through focus of structures of interest in the first test set for a range of phase depths/thicknesses;

selecting an initial preferred mask phase depth/thickness based on results of the simulating;

generating, by the processor, a fast thick-mask model (FTM) at the initial preferred phase depth/thickness;

correcting the second test set of the second mask layout design using the FTM, thereby providing an optimized mask layout design;

in response to determining that phase depth/thickness optimization is sufficient, providing a mask that embodies the optimal phase depth/thickness; and in response to determining that phase depth/thickness optimization is insufficient:

identifying problematic features of the optimized mask layout design;

creating a next small test set of the identified problematic features to provide a next small test set mask layout design;

simulating, by the processor, critical dimensions through focus of features in the next small test set mask layout design for a range of phase depths/thicknesses;

selecting a next preferred mask phase depth/thickness based on results of the simulating critical dimensions through focus of features in the next small test set mask layout design;

generating, by the processor, a next FTM at the selected next preferred phase depth/thickness based on results of the simulating critical dimensions through focus of features in the next small test set mask layout design;

further correcting the second test set of the second mask layout design using the next FTM, thereby providing a further optimized mask layout design; and determining whether phase depth/thickness optimization is sufficient for the further optimized mask layout design.

14. A lithography mask made using the method of claim 13.

15. A lithography system comprising the mask of claim 14.

16. A computer-implemented method for making a lithography mask, comprising:

providing a first mask layout design including a first test set;

providing a second mask layout design including a second test set, wherein the second test set is larger than the first test set;

simulating, by a processor, critical dimensions through focus of structures of interest in the first test set for a range of phase depths/thicknesses;

selecting an initial preferred mask phase depth/thickness based on results of the simulating;

generating by the processor, a fast thick-mask model (FTM) at the initial preferred phase depth/thickness;

correcting the second test set of the second mask layout design using the FTM, thereby providing an optimized mask layout design; and implementing a lithography mask having the optimized mask layout design.

17. The method of claim 16 further comprising:

determining whether phase depth/thickness optimization is sufficient.

18. The method of claim 17 further comprising:

in response to determining that phase depth/thickness optimization is sufficient, providing a mask layout design having an optimal phase depth/thickness.

19. The method of claim 17 wherein in response to phase depth/thickness optimization being insufficient, the method further comprises:

identifying problematic features of the optimized mask layout design; and creating a next small test set of the identified problematic features to provide a next small test set mask layout design.

20. The method of claim 19 further comprising:

simulating, by the processor, critical dimensions through focus of features in the next small test set mask layout design for a range of phase depths/thicknesses; and selecting a next preferred mask phase depth/thickness based on results of the simulating critical dimensions through focus of features in the next small test set mask layout design.

21. The method of claim 20 further comprising:

generating, by the processor, a next FTM at the selected next preferred phase depth/thickness based on results of the simulating critical dimensions through focus of features in the next small test set mask layout design; and further correcting the second test set of the second mask layout design using the next FTM, thereby providing a further optimized mask layout design.

22. The method of claim 21 further comprising repeating the determining.

23. The method of claim 22 wherein in response to phase depth/thickness optimization still being insufficient, the method further comprises:

identifying problematic features of the further optimized mask layout design;

creating a next small test set of the identified problematic features to provide a next small test set mask layout design;

simulating, by the processor, critical dimensions through focus of features in the next small test set mask layout design for a range of phase depths/thicknesses;

selecting a next preferred mask phase depth/thickness based on results of the simulating critical dimensions through focus of features in the next small test set mask layout design;
generating, by the processor, a next FTM at the selected next preferred phase depth/thickness based on results of the simulating critical dimensions through focus of features in the next small test set mask layout design; and
further correcting the second test set of the second mask layout design using the next FTM, thereby providing a further optimized mask layout design.

* * * * *